(12) United States Patent
Kudo et al.

(10) Patent No.: US 8,471,301 B2
(45) Date of Patent: Jun. 25, 2013

(54) PHOTOELECTRIC CONVERSION DEVICE HAVING EMBEDDED RECESS REGIONS ARRANGED IN LIGHT-RECEIVING SURFACE

(75) Inventors: Masanori Kudo, Ayase (JP); Yoshiyuki Hayashi, Machida (JP); Kazuhiro Saito, Chofu (JP); Taro Kato, Kawasaki (JP); Yoshihiko Fukumoto, Isehara (JP)

(73) Assignee: Canon Kabushiki Kaisha, Tokyo (JP)

( * ) Notice: Subject to any disclaimer, the term of this patent is extended or adjusted under 35 U.S.C. 154(b) by 292 days.

(21) Appl. No.: 12/963,350

(22) Filed: Dec. 8, 2010

(65) Prior Publication Data

US 2011/0140219 A1   Jun. 16, 2011

(30) Foreign Application Priority Data

Dec. 14, 2009  (JP) ................. 2009-283449

(51) Int. Cl.
*H01L 31/0236* (2006.01)

(52) U.S. Cl.
USPC ........... 257/230; 257/258; 257/445; 257/461; 257/E31.004

(58) Field of Classification Search
USPC ....................................... 257/445
See application file for complete search history.

(56) References Cited

U.S. PATENT DOCUMENTS

| | | | |
|---|---|---|---|
| 2001/0042864 A1 | 11/2001 | Kato | |
| 2005/0029560 A1* | 2/2005 | Wasshuber et al. | 257/288 |
| 2005/0040440 A1 | 2/2005 | Murakami | |
| 2006/0011955 A1 | 1/2006 | Baggenstoss | |
| 2007/0138590 A1 | 6/2007 | Wells | |
| 2008/0197388 A1 | 8/2008 | Park | |
| 2009/0230491 A1* | 9/2009 | Iida | 257/432 |

FOREIGN PATENT DOCUMENTS

| | | |
|---|---|---|
| JP | 06-125068 A | 5/1994 |
| JP | 6-125068 A | 5/1994 |
| JP | 2005-072097 A | 3/2005 |
| JP | 2008-135564 A | 6/2008 |

* cited by examiner

*Primary Examiner* — Stephen W Smoot
(74) *Attorney, Agent, or Firm* — Canon U.S.A., Inc. IP Division

(57) ABSTRACT

A device includes a plurality of photoelectric conversion regions, an interlayer insulating film arranged on the plurality of photoelectric conversion regions, a protective insulating film that is arranged in contact with the interlayer insulating film and has a refractive index different from that of the interlayer insulating film, recesses arranged in a light-receiving surface of each of the plurality of photoelectric conversion regions, and embedded regions embedded in the recesses. When a wavelength of incident light to each of the plurality of photoelectric conversion regions is denoted by $\lambda$ and a refractive index of the embedded regions is denoted by n, a depth d of the recesses is represented by an expression $d \geq \lambda/4n$.

18 Claims, 4 Drawing Sheets

PHOTOELECTRIC CONVERSION DEVICE HAVING EMBEDDED RECESS REGIONS ARRANGED IN LIGHT-RECEIVING SURFACE

BACKGROUND OF THE INVENTION

1. Field of the Invention

The present invention relates to the structure of a photoelectric conversion region in a photoelectric conversion device.

2. Description of the Related Art

As a photoelectric conversion region of each pixel of a photoelectric conversion device, a configuration in which a photodiode formed by PN junction between first and second conductivity-type semiconductor regions is included and in which an interlayer insulating film formed of a silicon oxide film or the like is arranged on the photodiode is known. The interlayer insulating film may have a protective insulating film, a color filter, or the like provided thereon, or may be in direct contact with air. A photoelectric conversion device having such a structure often exhibits, as the spectral characteristics thereof, characteristics in which an output has ripple in relation to the wavelength of incident light. Ripple occurs when the incident light undergoes multiple reflections at the interfaces between the photoelectric conversion region and the interlayer insulating film and between the interlayer insulating film and a film that is formed on the interlayer insulating film and has a refractive index different from that of the interlayer insulating film. More specifically, ripple occurs due to the film thickness distribution of the interlayer insulating film in a chip, which causes variation in the effect of the multiple reflections between the positions of the pixels arranged on the chip.

In order to reduce ripple, as described in Japanese Patent Laid-Open No. 6-125068, there is a scheme for reducing ripple by randomizing the effect of optical interference using a structure in which a foundation pattern is attached to an insulating film to vary the height of the surface of the insulating film and another structure in which an island-shaped metal layer is provided on the insulating film.

In addition, in Japanese Patent Laid-Open No. 2005-072097, there is disclosed a photoelectric conversion device in which recesses and projections are formed in the surface of a semiconductor substrate by etching in order to reduce reflection at the interface on the lower side of an insulating film.

In the case of the former structure disclosed in Japanese Patent Laid-Open No. 6-125068, however, since the shape of the surface of the protective insulating film is different depending on the position, the protection property may be affected. In addition, since the thickness of the protective insulating film itself varies depending on the position, the protection property is different for each position on a chip, which may not be desirable. Furthermore, in the case of the island-shaped metal layer being provided (in the case of the latter structure disclosed in Japanese Patent Laid-Open No. 6-125068), an aperture in the photoelectric conversion region is smaller, which may also not be desirable.

As to Japanese Patent Laid-Open No. 2005-072097, the specific sizes of the recesses and projections are not described clearly. The effect of ripple may not be reduced depending on the sizes of the recesses and projections.

SUMMARY OF THE INVENTION

A device according to an aspect of the present invention includes a plurality of photoelectric conversion regions, an interlayer insulating film arranged on the plurality of photoelectric conversion regions, a protective insulating film that is arranged in contact with the interlayer insulating film and has a refractive index different from that of the interlayer insulating film, recesses arranged in a light-receiving surface of each of the plurality of photoelectric conversion regions, and embedded regions embedded in the recesses. When a wavelength of incident light to each of the plurality of photoelectric conversion regions is denoted by $\lambda$ and a refractive index of the embedded regions is denoted by n, a depth d of the recesses is represented by an expression $d \geq \lambda/4n$.

Further features of the present invention will become apparent from the following description of exemplary embodiments with reference to the attached drawings.

DESCRIPTION OF THE EMBODIMENTS

Embodiments of the present invention are described hereinafter with reference to the drawings. In the following embodiments, a case in which holes are used as signal carriers is described. When using electrons as the signal carriers, an n-type semiconductor region is changed to a p-type semiconductor region and a p-type semiconductor region is changed to an n-type semiconductor region. Silicon is used for a semiconductor substrate in the following description.

First Embodiment

Figure 1:
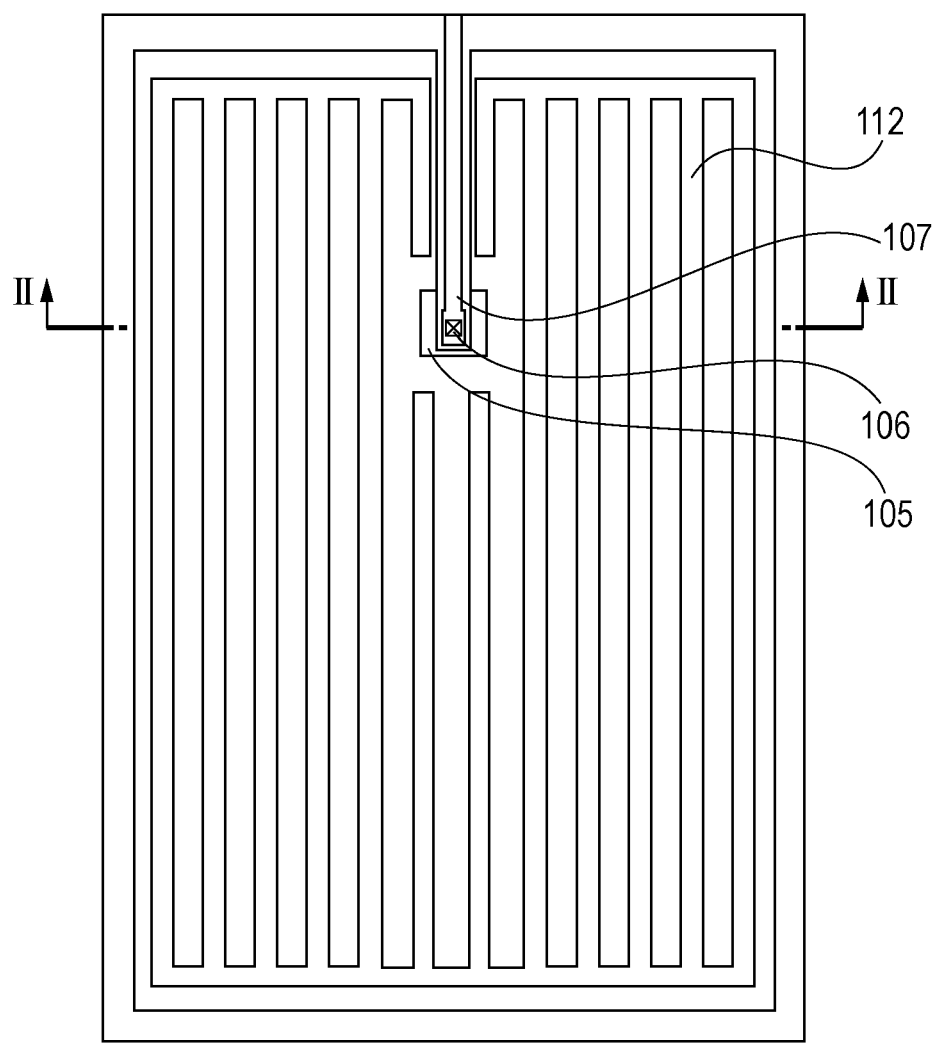
FIG. 1 is a plan view of a photoelectric conversion region according to a first embodiment of the present invention.
Figure 2:
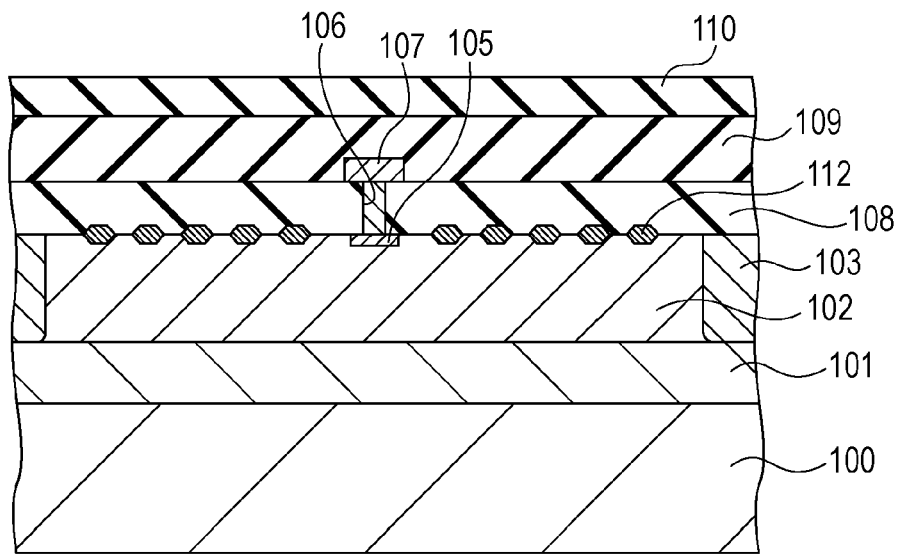
FIG. 2 is a schematic cross-sectional view of the photoelectric conversion region according to the first embodiment of the present invention.
Figure 3:
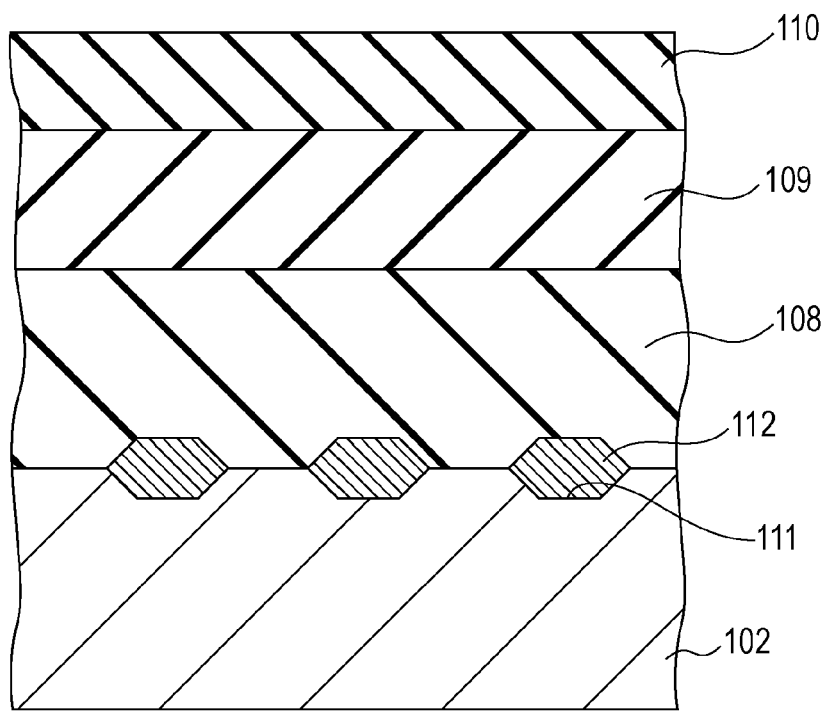
FIG. 3 is an enlarged schematic cross-sectional view of the photoelectric conversion region according to the first embodiment of the present invention.

FIG. 1 is a plan view of each of photoelectric conversion regions and a portion above each photoelectric conversion region in a photoelectric conversion device according to a first embodiment. FIG. 2 is a schematic cross-sectional view taken along line II-II of FIG. 1. FIG. 3 is an enlarged schematic view of the cross-section shown in FIG. 2. In FIGS. 1 to 3, the same components are given the same reference numerals. The photoelectric conversion regions herein are PN-junction photodiodes. A photoelectric conversion device according to the first embodiment of the present invention has a configuration in which a plurality of pixels each including a photoelectric conversion region are arranged on a semiconductor substrate.

Although a first semiconductor region 100 may be of an n-type or a p-type, the first semiconductor region 100 is formed of a region having a relatively low impurity concentration. Here, the first semiconductor region 100 is an n-type semiconductor region. For the first semiconductor region 100, for example, the semiconductor substrate itself may be used. The term "semiconductor substrate" herein refers to a semiconductor substrate serving as a material substrate.

A second semiconductor region 101 is an embedded n-type semiconductor region arranged on the first semiconductor region 100.

A third semiconductor region 102 is an n-type semiconductor region arranged on the second semiconductor region 101 and may be formed by, for example, epitaxial growth. The third semiconductor region 102 has an impurity concentration lower than that of the second semiconductor region 101 and the signal carriers therein are the minority carriers.

A fourth semiconductor region 103 is formed of an n-type semiconductor region and separates adjacent photoelectric conversion regions from each other. The fourth semiconductor region 103 is provided around each photoelectric conversion region and surrounds the photoelectric conversion region completely. In addition, the photoelectric conversion region of each pixel is covered by the second semiconductor region 101 at the bottom and surrounded by the fourth semiconductor region 103 at the sides.

A fifth semiconductor region 105 is formed of a p-type semiconductor region and can collect holes, which are the signal carriers. In this region, the signal carriers are the majority carriers. The fifth semiconductor region 105 is a region for establishing electrical connection to a readout circuit, which is not shown. A contact hole 106 is provided above the fifth semiconductor region 105 and the fifth semiconductor region 105 is connected to the readout circuit through a metal electrode 107 with which the contact hole 106 is filled. For the readout circuit, for example, a source follower formed of metal-oxide-semiconductor (MOS) transistors may be used. In that case, the fifth semiconductor region 105 is electrically connected to a gate of an amplifying MOS transistor. The surfaces of the third semiconductor region 102 and the fifth semiconductor region 105 together form a light-receiving surface of the photoelectric conversion region.

A first interlayer insulating film 108 is arranged on the photoelectric conversion region and may be formed of, for example, a boro-phospho silicate glass (BPSG) film obtained by atmospheric or subatmospheric pressure chemical vapor deposition (CVD). As a second interlayer insulating film 109A, a $SiO_2$ film obtained by plasma CVD may be used. Although the interlayer insulating films herein have a two-layer structure, there may be a single layer or multiple layers. The refractive indices of the first and second interlayer insulating films 108 and 109 are substantially the same, that is, a refractive index $n_1$ of each of the first and second insulating films 108 and 109 is, for example, 1.46.

A protective insulating film 110 is provided as necessary and may be formed as a single-layer or multiple-layer film by using SiON (silicon oxynitride), SiN (silicon nitride), $SiO_2$, and/or the like obtained by plasma CVD. The protective insulating film 110 has a portion in contact with the second interlayer insulating film 109 and the refractive index of the portion in contact with the second interlayer insulating film 109 is different at least from that the second interlayer insulating film 109. The entire protective insulating film 110 may have a refractive index different from those of the first and second interlayer insulating films 108 and 109, instead. A color filter or a microlens may be provided instead of the protective insulating film 110, or no component may be provided, leaving the second interlayer insulating film 109 directly exposed to air. In any case, the second interlayer insulating film 109 forms an interface with a member having a different refractive index.

Recesses 111 are provided in the light-receiving surface of the photoelectric conversion region. The recesses 111 may be formed by etching or through a thermal oxidation process using a local oxidation of silicon (LOCOS) method.

Embedded regions 112 are arranged so that the recesses 111 are embedded therewith. For the embedded regions 112, so-called LOCOS regions formed by the LOCOS method may be used. When silicon oxide is used for the embedded regions 112, the refractive index $n_2$ of the embedded regions 112 is substantially the same as those of the first and second interlayer insulating films 108 and 109.

When, as described later, the wavelength of incident light is denoted by λ and the refractive index of the embedded regions 112 is denoted by n, the depth d of the recesses 111 is a value that satisfies the following relationship:

$$d \geq \lambda/4n \qquad 1$$

The depth d herein is measured from a region in which the recesses 111 are not provided. In addition, in the case of a photoelectric conversion device for visible light, the wavelength of incident light ranges from 360 to 400 nm on the shorter wavelength side, and 760 to 830 nm on the longer wavelength side. The wavelength of incident light may be determined as 360 nm since an effect can be achieved at least with light on the shorter-wavelength side. To achieve an effect over the entire range of wavelengths of visible light, the wavelength of incident light may be determined as 830 nm. If a color filter is provided for the photoelectric conversion region, a peak wavelength of the color filter of its own color may be used as the wavelength of incident light. If the color filter has a Bayer pattern, a peak wavelength of light that passes through a blue color filter may be used as λ.

If, in the case of the photoelectric conversion device for visible light, the embedded regions 112 embedded in the recesses 111 are composed of silicon oxide and if the photoelectric conversion region is arranged on a silicon substrate, the depth d of the recesses 111 may be a value that satisfies an expression $0.06 \leq d \leq 0.15$ μm. With the depth d in this range, reflected light having a phase opposite to that of light reflected from the region in which the recesses 111 are not provided is generated and these two types of light cancel each other out, which allows ripple to be reduced.

Next, the ripple reduction caused by the recesses 111 is described with reference to FIG. 3.

Incident light passes through the protective insulating film 110 and the first and second interlayer insulating films 108 and 109 and enters the photoelectric conversion region. At this time, because of multiple reflections that occur at the interfaces between the third semiconductor region 102 and the first interlayer insulating film 108 and between the second interlayer insulating film 109 and the member on the second interlayer insulating film 109, characteristics in which an output has ripple in relation to the wavelength are obtained as spectral characteristics. If the light-receiving surface is planar as in the related art, the characteristics in which the output has ripple are directly reflected in pixel output. In contrast, when the recesses 111 are provided, it is made possible to make optical-path lengths different from each other within a single photoelectric conversion region.

Figure 4:
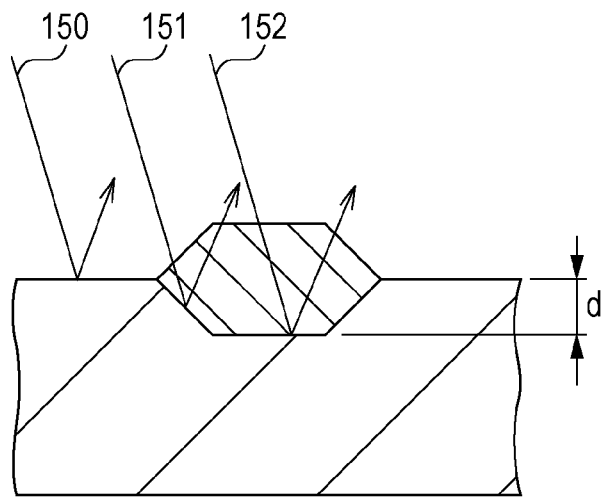
FIG. 4 is a schematic cross-sectional view illustrating the difference in optical-path length at a recessed and projected portion of a substrate according to the first embodiment of the present invention.

FIG. 4 is a schematic cross-sectional view illustrating one of the recesses. Light entering the recess is indicated by arrows 150, 151, and 152. The arrow 150 indicates light reflected from a region in which the recess is not provided, the arrow 152 indicates light reflected from the bottom surface of the recess, and the arrow 151 indicates light reflected from the sidewall of the recess.

By providing the recess, the optical-path length of each ray of incident light to the photoelectric conversion region can be made different from each other. With the optical-path lengths made different from each other, rays of light reflected from the interface between the photoelectric conversion region and the first interlayer insulating film can be provided with a phase difference, and thereby cancel each other out through interference. That is, the ripple of the output can be reduced by the effect of the interference.

When the wavelength of incident light is denoted by $\lambda$ and the refractive index of the embedded regions embedded in the recesses is denoted by n, if the phase film thickness is $\lambda/4n$, the phase of reflected light becomes opposite to that of the light reflected from the region in which the recesses are not provided. That is, when the depth d of the recesses is $\lambda/4n$, the effect of the interference is greatest and accordingly the ripple reduction effect is great.

When providing recesses in the surface of a semiconductor region, it is usually difficult to make the sidewalls of the recesses completely vertical, which means that the formed recesses are somewhat tapered. Therefore, when a bottom surface of each recess has a depth equal to or larger than $\lambda/4n$, there is certainly a region whose depth is $\lambda/4n$ somewhere from the bottom surface to a region having the same depth as the light-receiving surface (i.e. the depth is zero), and the light reflected from this region has the opposite phase. This makes it possible to reduce the ripple of the output. Especially when the recesses are formed by the LOCOS method as in this embodiment, a gradual incline called a "bird's beak" can be provided, which successfully widens a region in which the opposite-phase light is generated through reflection.

However, if the depth is $\lambda$ or more, the effect of dark current may be large, which may not be desirable. Therefore, the depth d of the recesses in the semiconductor substrate may be set in the range of $\lambda/4n \leq d \leq \lambda$.

Figure 7:
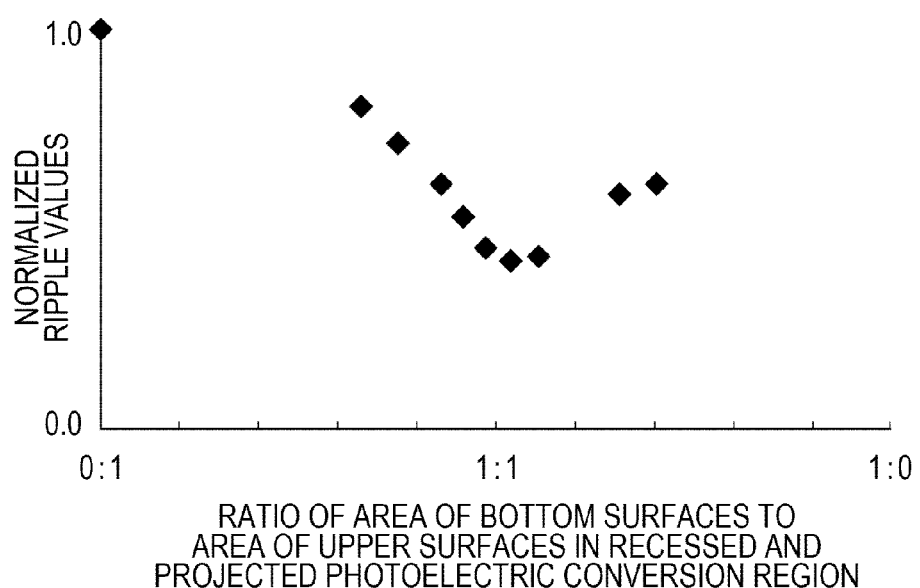
FIG. 7 is a graph illustrating the relationship between the ratio of the area of recesses in a pixel and the ripple reduction effect according to the first embodiment of the present invention.

FIG. 7 illustrates the amount of ripple when the area of the bottom surfaces of the recesses is varied. The amount of ripple is normalized to make the value of the amount of ripple when no recess is arranged in the photoelectric conversion region be 1. When the ratio R of the area of the recesses to the entire surface area of the photoelectric conversion region is about 0.5, the ratio of components interfering with each other is 1:1, thereby reducing the ripple by the largest amount. This is because the amount of reflected light having the opposite phase can be set close to the amount of light reflected from the region in which the recesses are not provided. In one embodiment, the ratio R is 0.5 in order to allow the amounts of the two types of reflected light having the opposite phases that cancel each other out to be close to each other, but so long as the ratio R is in the range of $0.4 \leq R \leq 0.6$, a great effect can be achieved. As a way to realize such a configuration, the recesses to be provided in the third semiconductor region are arranged in a repetitive pattern with a certain pitch, as illustrated in FIG. 2. The area of the recesses herein is determined by using the area of the openings of the recesses.

When the recesses in the photoelectric conversion region are formed by a scheme using an isolation method as in this embodiment, it is possible to simultaneously provide the recesses and the formation and element isolation of transistors in peripheral circuits, thereby successfully omitting additional manufacturing steps. Although not shown, element isolation using the LOCOS method may be performed to isolate pixels. The recesses can also be effectively formed by a method using etching, such as a shallow trench isolation (STI) method.

Now, where to arrange recesses in the photoelectric conversion region is described. The recesses in the light-receiving surface of the photoelectric conversion region are arranged at positions separated from the fifth semiconductor region 105 by a distance of 1.0 μm or more, so that the fifth semiconductor region 105 is surrounded by the third semiconductor region 102. With such a configuration, the dark current generated at the interface between the recesses 111 and the embedded regions 112 can be suppressed. By keeping the depletion layer of the PN junction, which forms the photoelectric conversion region, from coming into contact with edges of the recesses, the dark current can also be successfully suppressed.

Second Embodiment

Figure 5:
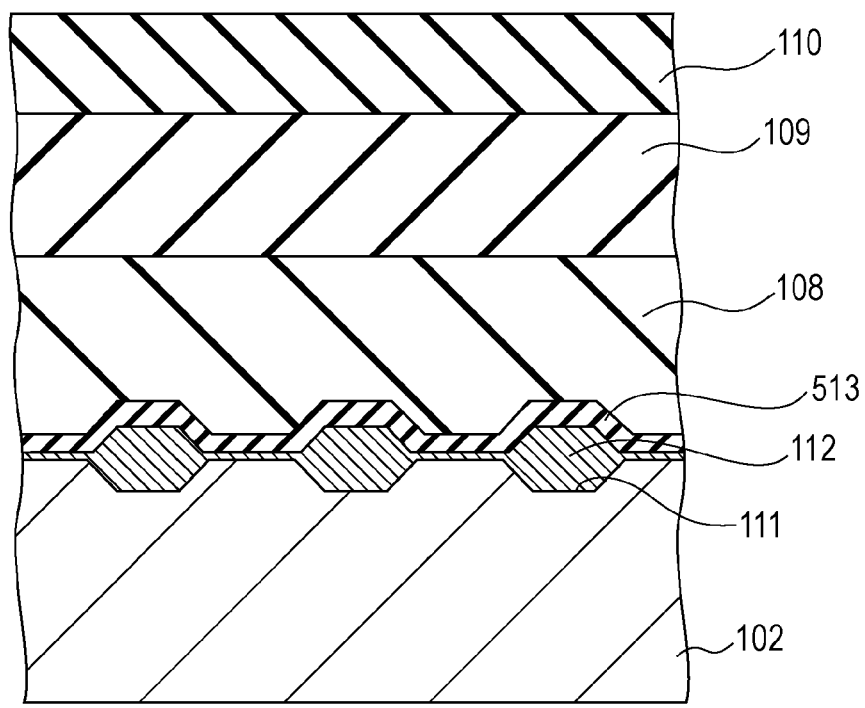
FIG. 5 is a schematic cross-sectional view of a photoelectric conversion region according to a second embodiment of the present invention.

FIG. 5 is a schematic cross-sectional view of a photoelectric conversion region according to this embodiment. The same reference numerals are given to components having functions similar to those of the first embodiment and therefore detailed description thereof is omitted.

A feature of this embodiment is that a structure is provided in which a film having a refractive index higher than that of the first interlayer insulating film 108 is arranged on the embedded regions 112 embedded in the recesses 111. The film is, for example, a silicon nitride film 513 having a refractive index n of 2.0. The silicon nitride film 513 functions as an anti-reflection film. With the silicon nitride film 513, reflection at the interface between the first interlayer insulating film 108 and the photoelectric conversion region can be suppressed, which realizes high sensitivity as well as ripple reduction.

Third Embodiment

Figure 6:
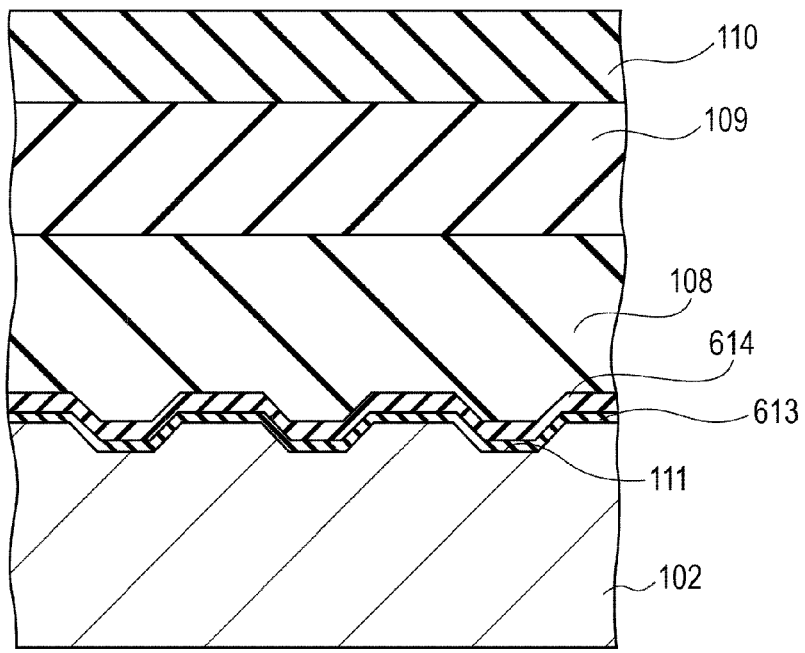
FIG. 6 is a schematic cross-sectional view of a photoelectric conversion region according to a third embodiment of the present invention.

FIG. 6 is a schematic cross-sectional view of a photoelectric conversion region according to this embodiment. The same reference numerals are given to components having functions similar to those of the first and second embodiments and therefore detailed description thereof is omitted.

A feature of this embodiment is that a structure in which an insulating film formed when the recesses 111 are formed is removed by wet etching or the like; in which a silicon oxide film 613 is formed over a plurality of photoelectric conversion regions as a first insulating film; and in which, directly on the silicon oxide film 613, a second insulating film having a refractive index higher than that of the silicon oxide film 613, such as a silicon nitride film 614, is formed. With the structure according to this embodiment, an anti-reflection effect can be achieved for the entire surface of a pixel, thereby obtaining yet higher sensitivity than in the second embodiment.

Although the present invention has been described with reference to each embodiment, it is to be understood that the present invention is not limited to the above-described configurations. For example, an embedded region embedded in the recesses 111 may be an organic film or a silicon nitride film instead of the silicon oxide film 613. In addition, the first interlayer insulating film 108 and an insulator embedded in the recesses 111 may be formed of different materials.

Furthermore, the configuration may include a transfer transistor that transfers an electric charge generated in the photoelectric conversion region to a floating diffusion.

The present invention is applied to a photoelectric conversion device used in a scanner or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-283449 filed Dec. 14, 2009, which is hereby incorporated by reference herein in its entirety.

What is claimed is:

1. A device comprising:
a plurality of photoelectric conversion regions;
an interlayer insulating film arranged on the plurality of photoelectric conversion regions;
a protective insulating film that is arranged in contact with the interlayer insulating film and has a refractive index different from that of the interlayer insulating film;
recesses arranged in a light-receiving surface of each of the plurality of photoelectric conversion regions; and
embedded regions embedded in the recesses,
wherein, when a wavelength of incident light to each of the plurality of photoelectric conversion regions is denoted by $\lambda$ and a refractive index of the embedded regions is denoted by n, a depth d of the recesses is represented by an expression $d \geq \lambda/4n$, and
wherein the plurality of photoelectric conversion regions includes a semiconductor region for collecting signal carriers, wherein a contact hole is provided above the semiconductor region for collecting signal carriers, and a metal electrode is filled in the contact hole,
the semiconductor region for collecting signal carriers is electrically connected to a readout circuit through the metal electrode, and
the semiconductor region for collecting signal carriers is not provided with recesses.

2. The device according to claim 1, further comprising:
an anti-reflection film that is arranged on the light-receiving surface and surfaces of the recesses of each of the plurality of photoelectric conversion regions and that has a refractive index higher than that of the interlayer insulating film.

3. The device according to claim 1, wherein the embedded regions include a first insulating film and a second insulating film that is arranged in contact with the first insulating film and has a refractive index higher than that of the first insulating film.

4. The device according to claim 1, wherein the recesses and the embedded regions are formed by a local oxidation of silicon (LOCOS) method.

5. The device according to claim 1, wherein each of the plurality of photoelectric conversion regions is configured by including a first semiconductor region and a second semiconductor region that forms a PN junction together with the first semiconductor region,
wherein the second semiconductor region is connected to a readout circuit, and
wherein the recesses are surrounded by the first semiconductor region.

6. The device according to claim 1, wherein the recesses are arranged in a repetitive pattern with a certain pitch.

7. The device according to claim 1, wherein the depth d of the recesses is in a range of $\lambda/4n \leq d \leq \lambda$.

8. The device according to claim 1, further comprising:
a color filter corresponding to each of the plurality of photoelectric conversion regions,
wherein the wavelength of the incident light is a peak wavelength of light that passes through the color filter.

9. The device according to claim 8, wherein the wavelength of the incident light is a peak wavelength of light that passes through a blue color filter.

10. A device for visible light comprising:
a plurality of photoelectric conversion regions arranged on a silicon substrate;
a silicon oxide film arranged on the plurality of photoelectric conversion regions;
a protective insulating film that is arranged in contact with the silicon oxide film and has a refractive index different from that of the silicon oxide film;
recesses arranged in a light-receiving surface of each of the plurality of photoelectric conversion regions; and
silicon oxide embedded regions embedded in the recesses, wherein a depth d of the recesses is in a range of $0.06 \leq d \leq 0.15$ μm, and
wherein the plurality of photoelectric conversion regions includes a semiconductor region for collecting signal carriers, wherein a contact hole is provided above the semiconductor region for collecting signal carriers, and a metal electrode is filled in the contact hole,
the semiconductor region for collecting signal carriers is electrically connected to a readout circuit through the metal electrode, and the semiconductor region for collecting signal carriers is not provided with recesses.

11. The device according to claim 10, further comprising:
an anti-reflection film that is arranged on the light-receiving surface and surfaces of the recesses of each of the plurality of photoelectric conversion regions and that has a refractive index higher than that of the silicon oxide film.

12. The device according to claim 10, wherein the silicon oxide embedded regions include a first insulating film and a second insulating film that is arranged in contact with the first insulating film and has a refractive index higher than that of the first insulating film.

13. The device according to claim 10, wherein the recesses and the silicon oxide embedded regions are formed by a local oxidation of silicon (LOCOS) method.

14. The device according to claim 10, wherein each of the plurality of photoelectric conversion regions is configured by including a first semiconductor region and a second semiconductor region that forms a PN junction together with the first semiconductor region,
wherein the second semiconductor region is connected to a readout circuit, and
wherein the recesses are surrounded by the first semiconductor region.

15. The device according to claim 10, wherein the recesses are arranged in a repetitive pattern with a certain pitch.

16. The device according to claim 10, wherein the depth d of the recesses is in a range of $\lambda/4n \leq d \leq \lambda$, where $\lambda$ is a wavelength of incident light to each of the plurality of photoelectric conversion regions and n is a refractive index of the silicon oxide embedded region.

17. The device according to claim 10, further comprising:
a color filter corresponding to each of the plurality of photoelectric conversion regions,
wherein a wavelength of the incident light is a peak wavelength of light that passes through the color filter.

18. The device according to claim 17, wherein the wavelength of the incident light is a peak wavelength of light that passes through a blue color filter.

* * * * *